(12) United States Patent
Roth et al.

(10) Patent No.: US 6,563,727 B1
(45) Date of Patent: May 13, 2003

(54) METHOD AND STRUCTURE FOR REDUCING NOISE EFFECTS IN CONTENT ADDRESSABLE MEMORIES

(76) Inventors: Alan Roth, 5012 Woodview Ave., Austin, TX (US) 78756; Hamed Ghassemi, 6100 Sierra Leon, Austin, TX (US) 78757

( * ) Notice: Subject to any disclaimer, the term of this patent is extended or adjusted under 35 U.S.C. 154(b) by 0 days.

(21) Appl. No.: 10/208,011

(22) Filed: Jul. 31, 2002

(51) Int. Cl.[7] .............................................. G11C 15/00
(52) U.S. Cl. ............................. 365/49; 365/51; 365/63
(58) Field of Search ............................. 365/49, 51, 63, 365/230.03

(56) References Cited

U.S. PATENT DOCUMENTS

| | | | |
|---|---|---|---|
| 5,155,700 A | * 10/1992 | Min et al. | 365/63 |
| 5,534,732 A | * 7/1996 | DeBrosse et al. | 257/776 |
| 5,602,772 A | * 2/1997 | Nakano et al. | 365/51 |
| 6,034,879 A | * 3/2000 | Min et al. | 365/63 |

* cited by examiner

*Primary Examiner*—Son T. Dinh
(74) *Attorney, Agent, or Firm*—Dowell & Dowell, P.C.

(57) ABSTRACT

A method for reducing the coupling noise in a Content Addressable Memory (CAM), the CAM having a first bitline pair and a second bitline pair, both pairs aligned along a first axis; a first memory cell connected to the first bitline pair and a second memory cell to the second bitline pair; having a first match line and a first word line aligned along a second axis, the first match line and the first word line connecting the first and the second memory cells defining a first row in a first column; having a second row adjacent the first row, the second row comprising a third cell and a fourth cell, the third and fourth cells connecting the first and second bitline pairs and a second word line and a second match line, the method comprising arranging the first memory cell in a first orientation and the second memory cell in a second orientation, wherein the second orientation being a first axis mirror image to the first orientation; segmenting the first and second bitline pairs between the first row and the second row; adding a first twisting structure to the first bitline pair and a second twisting structure to the second bitline pair; arranging the third cell in a third orientation, the third orientation being rotated 180 degrees with respect to the first orientation; and arranging the fourth cell in a fourth orientation, the fourth orientation being rotated 180 degrees with respect to the second orientation.

12 Claims, 5 Drawing Sheets

METHOD AND STRUCTURE FOR REDUCING NOISE EFFECTS IN CONTENT ADDRESSABLE MEMORIES

The present invention relates to a method and structure for reducing effects of noise coupling in signal lines of Content Addressable Memories (CAM's), and more particularly to a bit line structure that reduces the impact of noise to improve sensing of CAM cells.

BACKGROUND OF THE INVENTION

One problem with high integration density in semiconductor memories is that the operation characteristics of the memory device are adversely influenced by the coupling capacitance between bitlines, also referred as coupling noise. A memory array includes a number of word lines and complementary bitline pairs. Sensing amplifiers are provided in association with each bitline pair. As is known coupling capacitance exists between the individual bitlines of a certain bitline pair, and the adjoining bitline pairs. The noise is caused when there is a change in the voltage present in a particular bitline, such as when there is a change in logic value. Due to capacitive coupling, a change in one bitline may cause a similar change in a neighboring bit line, which is not intended to change. Such an undesired change in a bitline caused by capacitive coupling from a neighboring bitline is referred to as coupling noise. When noise appears across neighboring bit lines, the noise may be conducted to the sensing amplifier, and may erroneously be interpreted as data, lack of data, or undesirably modified data It is well known that by twisting bitline structures in memory arrays such as static random access memories SRAMs, or dynamic random access memories DRAMs, the noise induced into the bitline structure can be effectively lowered or canceled.

A similar problem is found in CAM devices where there is an increasing demand for higher integration density. The smaller dimensions result in an increase in bitline-to-bitline capacitance. In a CAM, however each column of storage cells is coupled to a search line in addition to being coupled to bitlines. The search lines are used for simultaneously comparing the bits of a search word stored in a compare register with the bits of data words stored in the cells. Wile binary CAMs are similar to traditional memories, ternary CAMs store data in pairs of storage elements, each pair called a ternary cell comprised of storage for two binary digits B0 and B1. This allows the ternary cell to store three logic states namely logic "0", logic "1" and "don't care".

The ternary CAM cell can be of two types namely DRAM or SRAM. In a DRAM-based CAM cell, each column of storage elements is coupled to a single bitline. That is, there are two bitlines per column of ternary CAM cells. In the case of an SRAM-based ternary CAM cell, each column of storage elements is coupled to a complimentary pair of bitlines. Thus the ternary SRAM CAM has two pairs of complementary bitlines per column of ternary CAM cells.

Bitlines also each have an inherent capacitance that varies with their dimensions. Ideally, each bitline is constructed to have essentially the same inherent capacitance in order to allow for consistent sensing across the entire memory.

Simply applying traditional twisted bitline techniques to such ternary CAM cells is not possible. It is known in the art that for ternary cells, to express a ternary logic value in particular, the position of the stored bit is important. The following table represents how the bits are stored in each half of the ternary cell:

| Logic Value | ½ Ternary cell 1 | ½ Ternary cell 2 |
| --- | --- | --- |
| 0 | 0 | 1 |
| 1 | 1 | 0 |
| "Don't Care" | 0 | 0 |

If the concept of twisting the bitlines as applied to a binary CAM cell is applied to a ternary CAM cell, the results would be that the bits will be stored in a different position. Since the position of the bit is crucial for the correct performance of the CAM, applying the prior art and by just twisting the bitlines will result in reading wrong data. Someone skilled in the art will notice that a solution to this problem can be twisting the search lines as well. Such solution while possible, is not feasible in a high density device as a CAM, where saving area is a must. For this reason, conventional ternary CAM devices do not employ the twisted bitline architecture as a result.

SUMMARY OF THE INVENTION

Accordingly, it is an objective of this invention to provide a method and structure for minimizing noise effects in a CAM device.

It is another objective of the invention to provide a method for structuring bitlines in a manner that ensures equal capacitance between adjacent bitlines.

In accordance with this invention there is provided a method for reducing the coupling noise in a Content Addressable Memory (CAM), the CAM having a first bitline pair and a second bitline pair, both pairs aligned along a first axis; a first memory cell connected to the first bitline pair and a second memory cell to the second bitline pair, having a first match line and a first word line aligned along a second axis, the it match line and the first word line connecting the first and the second memory cells defining a first row in a first column; having a second row adjacent the first row, the second row comprising a third cell and a fourth cell, the third and fourth cells connecting the first and second bitline pairs and a second word line and a second match line, the method comprising arranging the first memory cell in a first orientation and the second memory cell in a second orientation, wherein the second orientation being a first axis mirror image to the first orientation; segmenting the first and second bitline pairs between the first row and the second row; adding a first twisting structure to the first bitline pair and a second twisting structure to the second bitline pair; arranging the third cell in a third orientation, the third orientation being rotated 180 degrees with respect to the first orientation; and arranging the fourth cell in a fourth orientation, the fourth orientation being rotated 180 degrees with respect to the second orientation.

In accordance with another aspect of the invention there is provided a semiconductor memory device having a noise effect reducing structure, said memory device comprising:

a first bitline pair and a second bitline pair, said first and second bitline pairs aligned along a first axis;

a first memory cell connected to said first bitline pair and a second memory cell connected to said second bitline pair;

a first match line and a first word line aligned along a second axis, said first match line and said first word fine connecting said first and said second memory cells defining a first row in a first column;

a second row defined above said first row, said second row comprising a third memory cell and a fourth memory cell, said third and fourth memory cells connecting said first and second bitline pairs and a second word line and a second match line;

said first bitline pair comprising a twisted structure between said first row and said second row;

said second bitline pair comprising a second twisted structure between said first row and said second row;

said first memory cell having a first orientation and said second memory cell having a second orientation, wherein said second orientation is a mirror image of said first orientation;

said third memory cell having a third orientation, said third orientation being rotated 180 degrees with respect to said first orientation; and said fourth memory cell having a fourth orientation, said fourth orientation being rotated 180 degrees with respect to said second orientation.

BRIEF DESCRIPTION OF THE DRAWINGS

A better understanding of the invention will be obtained by reference to the detailed description below in conjunction wit de following drawings in which.

DETAILED DESCRIPTION OF THE PREFERRED EMBODIMENTS

Figure 1:
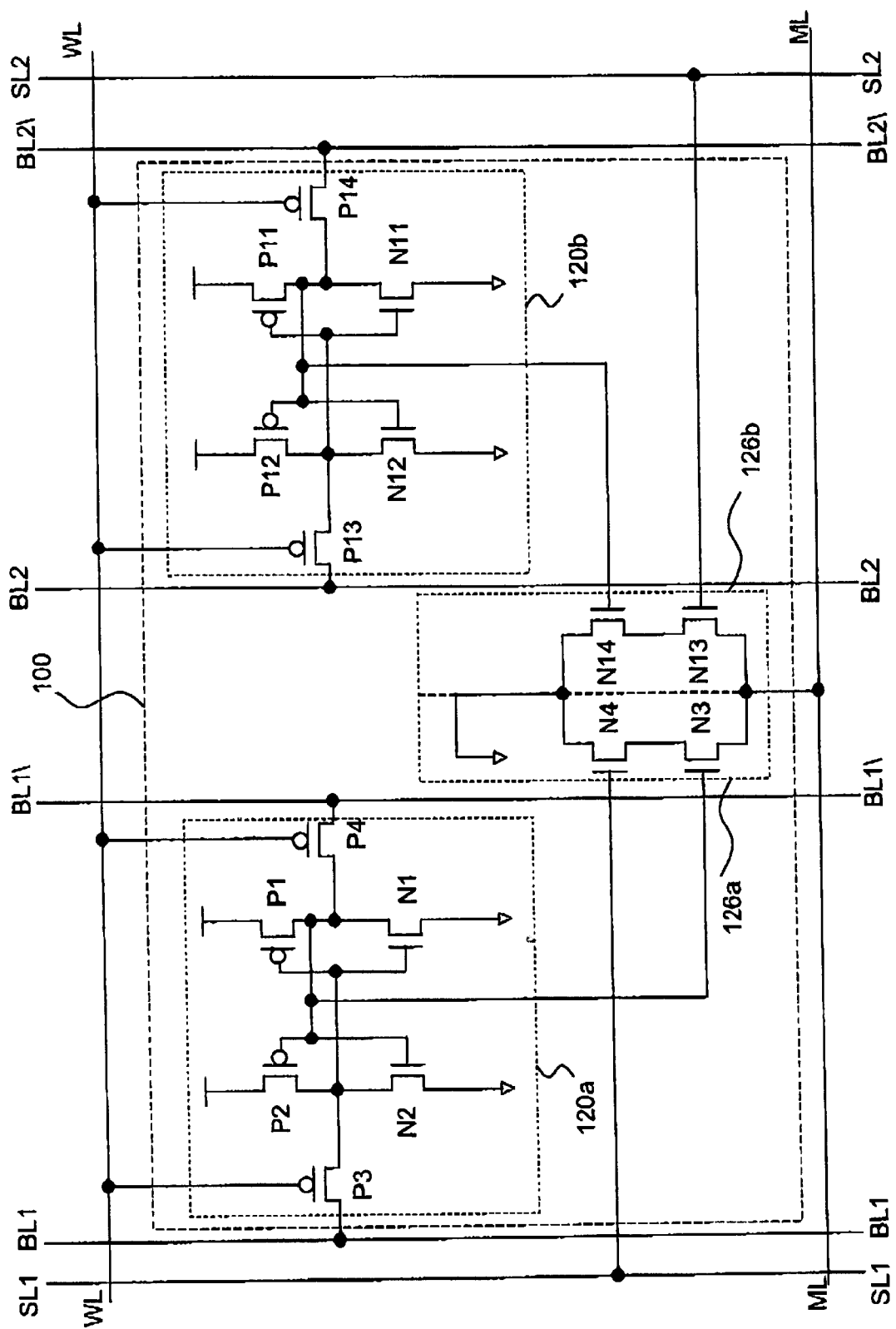
FIG. 1 is a circuit diagram of a ternary SRAM-based CAM cell.

In the following description, like numerals refer to like structures in the drawings.

Referring to FIG. 1, there is shown a circuit diagram of a conventional SRAM based ternary CAM cell 100. The ternary CAM cells comprises two six-transistor (6T) SRAM storage elements (ternary half-cell) 120a, 120b. Each half-cell 120a, 120b comprises two p-channel transistors and two n-channel transistors in a cross-coupled inverter configuration. A pair of transistors P3 and P4 controlled by a word line WL, provide access from a corresponding pair of bitlines BL1, BL1\. Each half-cell 120a, 120b includes a comparison circuit 126a, 126b for implementing an exclusive-NOR function for comparing search data applied to respective search lines SL1, SL2 with data stored in the respective half-cells 120a, 120b Each of the comparison circuits 126a, 126b are coupled to a common match line (ML) as mentioned earlier. The operation of this conventional SRAM CAM cell is well known and will not be discussed further.

Figure 2:
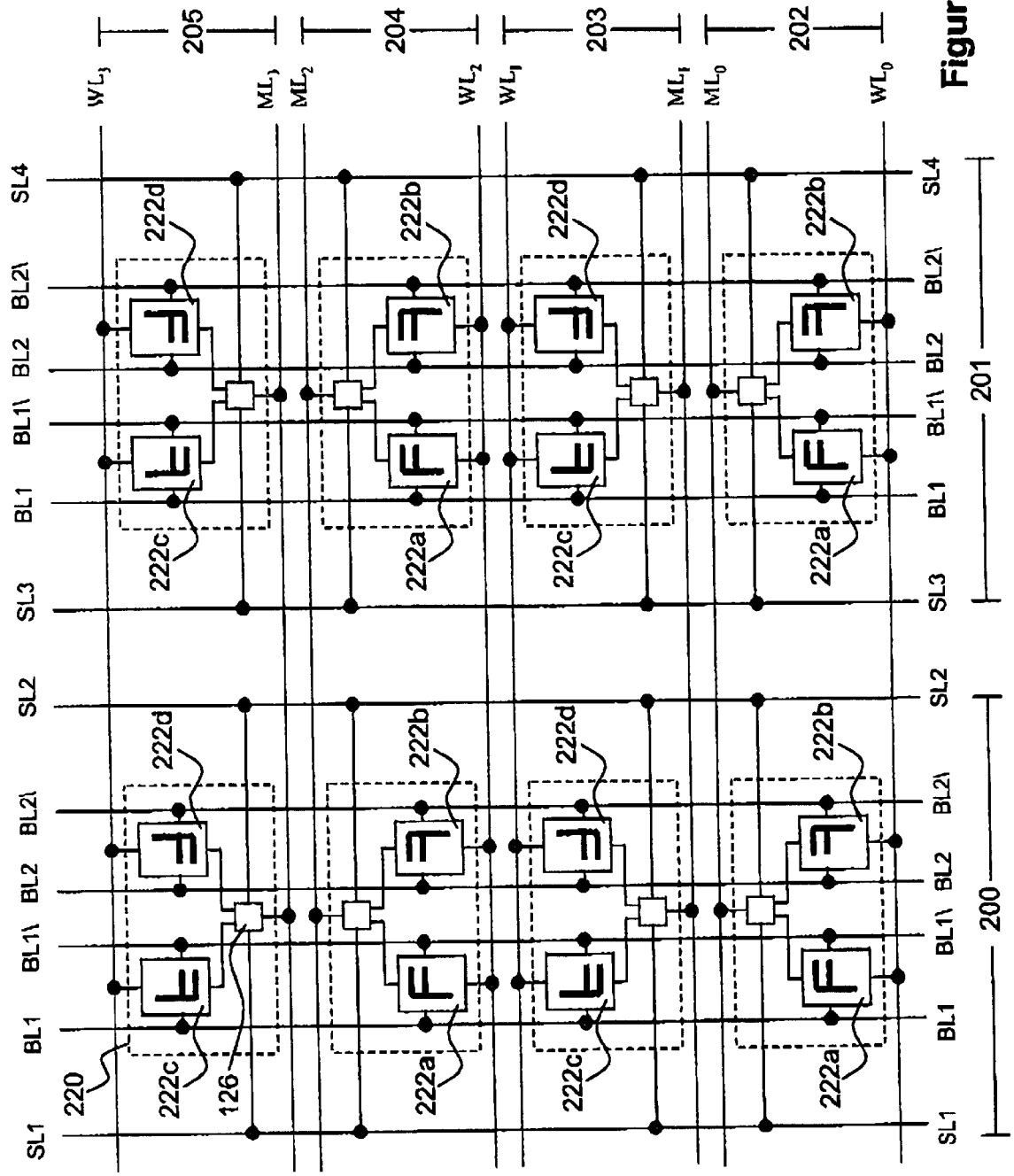
FIG. 2 is a schematic diagram showing a simplified portion of a CAM array according to the prior art.

Refining now to FIG. 2, there is shown, a simplified schematic diagram of a portion of a CAM array, according to the prior art. Each ternary CAM cell 110 is made up of two ternary half-cells 120a, 120b and a search block 126. Each ternary half-cell 120a, 120b is represented in FIG. 2 by a block 222 with an "F" symbol therein representing the orientation of the cell. Groups of four ternary half-cells 222a, b, c, d are oriented in one of four positions. That is, each ternary CAM cell 220 comprises a pair of mirror imaged ternary half-cells e.g. 222a, b formed in the semi-conductor material. The cells in two adjacent Tows 202 and 203, e.g. 222a, c and 222b, d are comprised of cells which are ranged as mirror images-along a horizontal axis between the rows of cells. A group of two ternary cells 222a, b, c and d, is firer duplicated forming a column 200 of ternary cells comprising rows 202, 203, 204 and 205. As can be seen in this figure, a second column 201 is a mirror image to the first column C1—along a vertical axis—. In this figure, the search lines SL1, SL2, SL3 and SL4, as well as the bitlines BL1, BL1\, BL2 and BL2\ are untwisted. As previously mentioned, this design suffers the effect of the coupling noise caused by the capacitive coupling between neighboring bitlines.

Figure 3A:
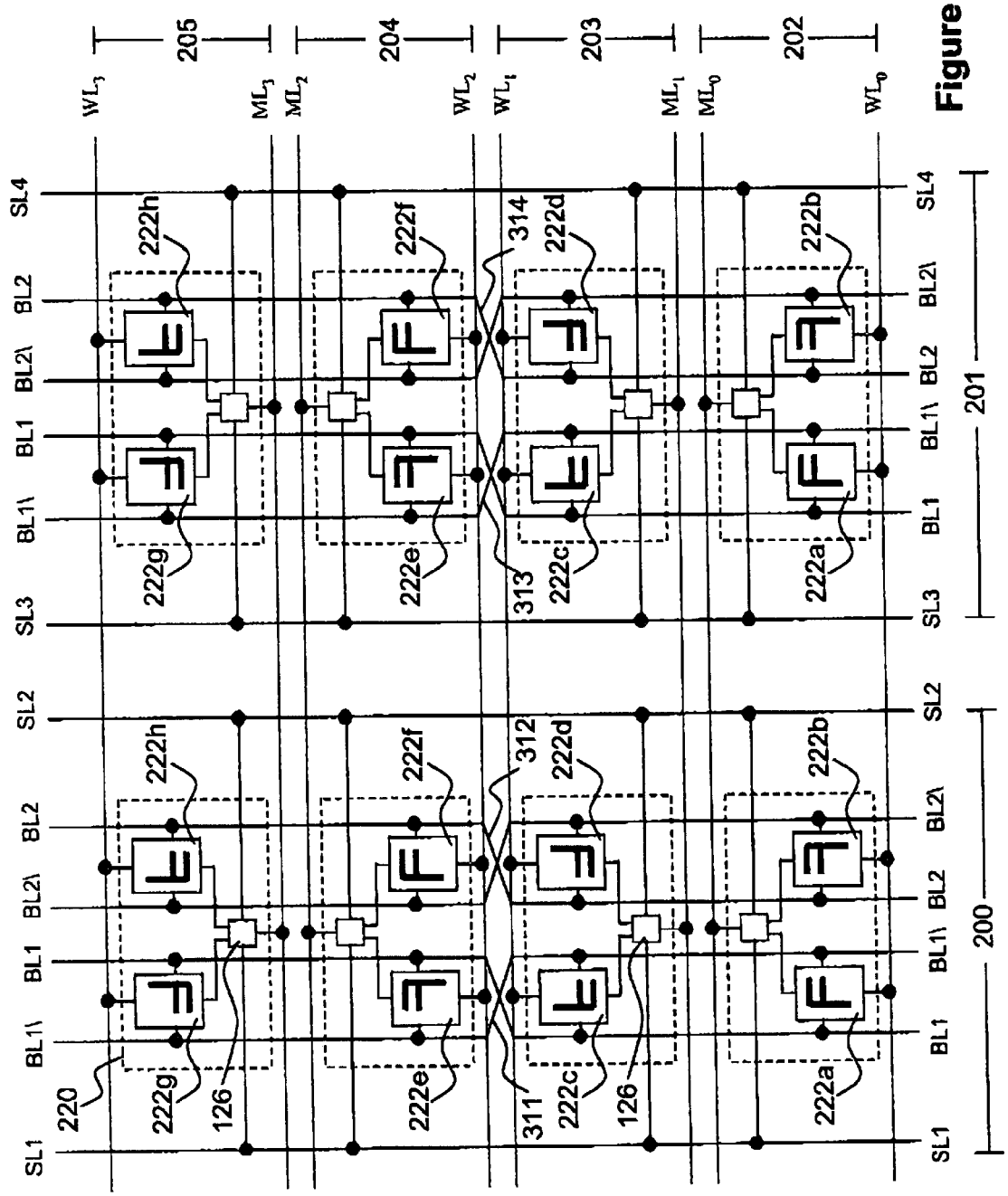
FIG. 3A is a schematic diagram showing a simplified portion of a CAM array according to an embodiment of the present invention.

Referring now to FIG. 3A there is shown a layout of a portion of a CAM having a twisted bitline structure 311 and 312 for each pair of bitlines BL1 BL1\ and BL2, BL2\ according to an embodiment of the present invention, which solves the problems that may arise for just twisting the bitlines as in the prior art. The twisted bitline structure is located between the rows 203 and 204. For a given column of ternary cells this arrangement may be repeated for successive ternary half CAM cells in different rows In order to solve the problems arising from twisting the bitlines in a ternary CAM, each half of the ternary cells have to be reoriented 180 degrees or, in other terms, mirrored horizontally and vertically with respect to the neighboring half cell in the adjacent row where the twisting is applied. Since the twisted bitline structures 311 and 312 are located between rows 203 and 204, the exemplification of the invention is focused on the orientation of half cells 222c, 222d from row 203 and the resulting orientation of half cells 222e and 222f in row 204. Since half cell 222c is part of the ternary cell that is closest to the twisted bitline structure 311, the neighboring half cell 222e in row 204 has its orientation rotated 180 degrees, or mirrored vertically and then horizontally from the orientation of half cell 222c. The same reorientation is present between neighboring half cells 222d and 222f. Once the reorientation has been done, the rules for orienting the ruing cells are applied as in the prior art as long as the bitlines are not twisted, i.e. half cell 222g is an horizontal mirror image to cell 222e and half cell 222h is a vertical mirror image to half cell 222g respectively. In this case, the second column 201 is again a vertical mirror image to column 200 and the twisted bitline structure 313 and 314 are located between rows 203 and 204 as well. This structure accomplishes the advantage of reducing the coupling noise between bitlines pairs and does not require changes to the structure of the search lines.

Figure 3B:
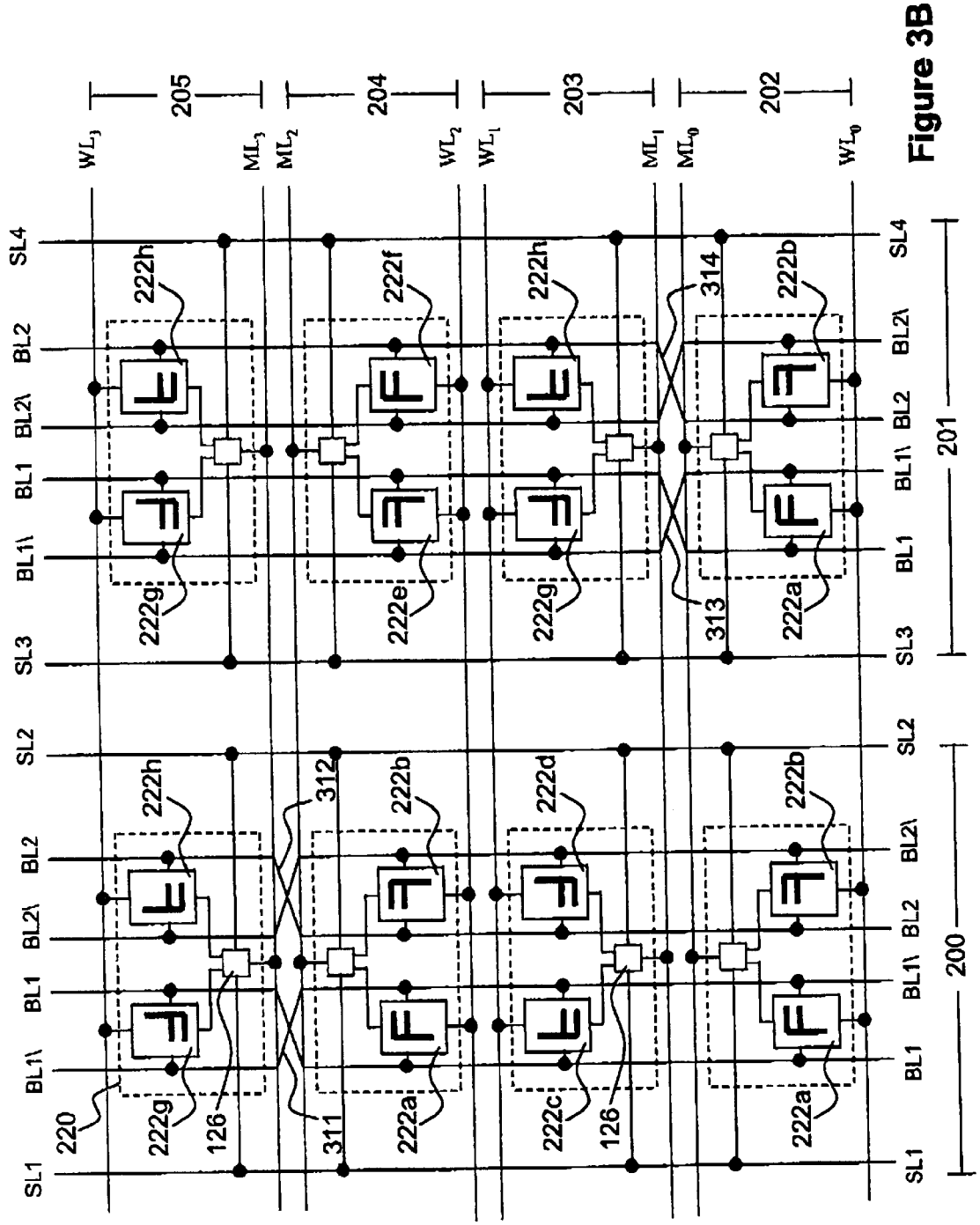
FIG. 3B is a schematic diagram showing a simplified portion of a CAM array according to another embodiment of the present invention.

Referring to FIG. 3B there is shown a layout of a portion of a CAM having a twisted bitline structure according to a further embodiment of the invention. FIG. 3B is based on FIG. 3A, with the difference that the twisted bitlines structures 311 and 312 on column 200 is located between rows 204 and 205, and twisted bitlines structures 313 and 314 are located between rows 202 and 203. The numerals used for describing this figure are similar as the used on the description of FIG. 3A. Row 202 is similar to the rows 202 on FIGS. 2 and 3A respectively, the ternary cells being comprised of half cells 222a and 222b in both columns 200 and 201. For column 200, the ternary cells 220 on rows 202, 203 and 204 are similar to the cells in FIG. 2, changing the orientation of the half cells 222g and 222h because the twisted bitline structures 311 and 312 were positioned between tows 204 and 205. Applying the teachings of the invention, the half cell 222g is rotated 180 degrees from the orientation of half cell 222a in row 204, or has been mirrored horizontally and vertically one half cell with respect to the other. The same applies to the orientation between cells 222b and 222h. The orientation of half cells 222g and 222h are vertical mirror images of themselves. For column 201, the twisted bitlines structures 313 and 314 are located between rows 202 and 203. Here the half cell 222g of row 203 has been 180 degrees reoriented with respect to the orientation of half cell 222a in row 202, while half cell 222h reoriented 180 degrees with respect to half cell 222b in row 202. The ternary cell in row 204 is a horizontal mirror image to the ternary cell in row 203, as well as ternary cell in row 205 is a horizontal mirror image to the ternary cell in row 204. The present embodiment has the advantage that, even though it reduces the coupling noise between bitline pairs, it further reduces the coupling noise between the bitline pairs of different columns, while preserving the search lines SL1, SL2, SL3 and SL4 with a straight structure. As can be seen for those experts in the art, several positions can be chosen to twist the bitlines and several twist structures can be added to a column in different positions to further reduce the coupling noise effects. The number of rows of ternary cells in a column, between twisted bitline structures, can vary according to the requirements that best fit the design.

Figure 4:
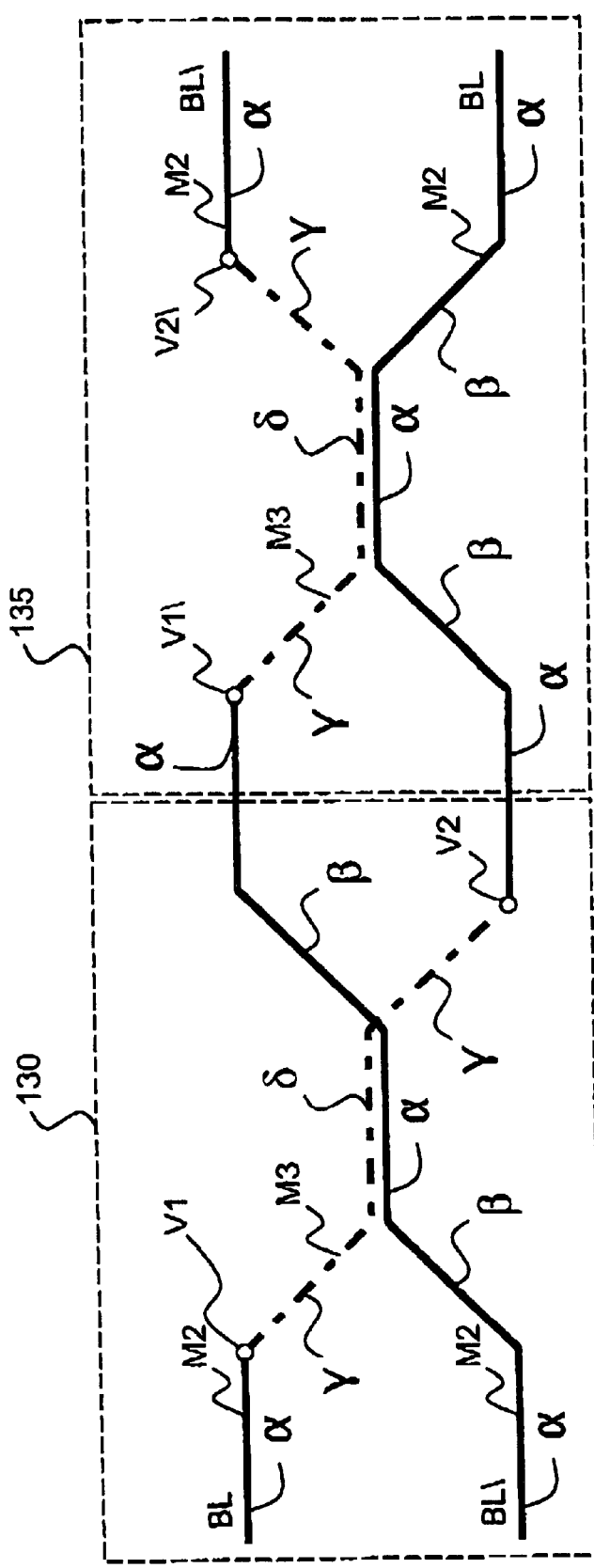
FIG. 4 is a schematic plan view of a crossover structure using a two metal process.

Referring now to FIG. 4 there is shown a plan view of a cross-over structure, which is formed in a semiconductor material, for a complementary twisted bitline pair BL, BL\ according to an embodiment of the present invention. The object of the structure shown in FIG. 5 is to illustrate how a complementary bitline pair can be twisted using two available metal layers while ensuring that both bitlines in the pair have equal capacitive characteristics. Only a portion of the bitline pair in the region of the twisted cross-over structure is shown. Both bitlines BL, BL\ are formed in parallel in a first metal layer for example metal 2 (M2). The cross-over structure for twisting the bitline pair is comprised of first and secondsegments 130 and 135. In the first segment 130, one of the bitlines BL is coupled through a via V1 to a another metal layer such as metal layer 3 (M3), where it passes over bitline BL\, which also crosses-over remains in metal layer 2 (M2). The bitline BL is then brought back to the metal layer 2 (M2) through another via V2. In the second region 135, the bitline BL\ and is coupled through a via V1\ to metal layer 3 (M3) and BL is then brought back to metal layer 2 (M2) through another via V2\.

The portions of both BL and BL\ and in this first segment and second segments 130 and 135 respectively are chosen to be equivalent and the number of vias and 45 degree portions are also chosen to be equivalent. More specifically, in the first region 130, BL is comprised of two M2 horizontal portions α, two 45 degree M3 angled portions γ, and one horizontal M3 portion δ. In the same first segment, BL\ is comprised of three M2 horizontal portions α, and two 45 degree M2 angled portions β. Also in this first region 130, BL has two vias V1 and V2 which are used to connect between M2 and M3. In the second region 135, BL is comprised of three M2 horizontal portions α, and two M2 45-degree portions β while BL\ is comprised of two M2 horizontal portions α, two M3 45 degree portions γ, and one M3 horizontal portion δ. Also, in the second region 135 BL\ has two vias V1\ and V2\, which are used to connect between M2 and M3. As a result, when combined together, the first and second segment have equal number of portions and vias for each of the bitlines in the bitline pair BL and BL\. Specifically, both BL and BL\ each have 4 α portions, 2 β portions, 2 γ portions, 1 δ portion and 2 vias. Thus it may be seen that both bitlines BL, BL\ extend for equivalent lengths in the two metal layers. Furthermore the twisted bitline structure has an equal number of via's on each bitline. The proximity of the first and second regions is also chosen to be relatively close, thus the crossover structure has little or no effect on mismatch between the bitlines BL, BL\.

It may be seen then that the present invention provides a viable layout for using a twisted bitline structure in a ternary CAM.

Although the invention has been described with reference to specific embodiments, various modifications will become apparent to a person skilled in the art with departing from the spirit of the invention.

The Embodiments of the invention in which an exclusive property or privilege is claimed are defined as follows:

1. A method for reducing the coupling noise in a Content Addressable Memory (CAM), said CAM having a first bitline pair and a second bitline pair, each aligned along a first axis; a first half memory cell connected to said first bitline pair and a second half memory cell to said second bitline pair; having a first match line and a first word line aligned along a second axis, said first match line and said first word line connecting said first half and said second half memory cells defining a first row in a first column; a second row adjacent said first row, said second row comprising a third half cell and a fourth half cell, said third and fourth half cells connecting said first and second bitline pairs and a second word line and a second match line, said method comprising:

(a) arranging said first half memory cell in a first orientation and said second half memory cell in a second orientation, wherein said second orientation is a mirror image of said first orientation;
   (b) twisting said first and second bitline pairs between said first row and said second row;
   (c) arranging said third half cell in a third orientation, said third orientation being rotated 180 degrees with respect to said first orientation; and
   (d) arranging said fourth half cell in a fourth orientation, said fourth orientation being rotated 180 degrees with respect to said second orientation.

2. A method for reducing the coupling noise in a Content Addressable Memory (CAM), said CAM having a first bitline pair and a second bitline pair, both pairs aligned along a first axis; a first memory cell connected to said first bitline pair and a second memory cell to said second bitline pair; having a first match line and a first word line aligned along a second axis, said first match line and said first word line connecting said first and said second memory cells defining a first row in a first column; having a second row adjacent said first row, said second row comprising a third cell and a fourth cell, said third and fourth cells connecting said first and second bitline pairs and a second word line and a second match line, said method comprising:

(a) arranging said first memory cell in a first orientation and said second memory cell in a second orientation, wherein said second orientation being a first axis mirror image to said first orientation;
   (b) segmenting said first and second bitline pairs between said first row and said second row;
   (c) adding a first twisting structure to said first bitline pair and a second twisting structure to said second bitline pair;
   (d) arranging said third cell in a third orientation, said third orientation being rotated 180 degrees with respect to said first orientation; and
   (e) arranging said fourth cell in a fourth orientation, said fourth orientation being rotated 180 degrees with respect to said second orientation.

3. A semiconductor memory device having a noise effect reducing structure, said memory device comprising:
- a first bitline pair and a second bitline pair, said first and second bitline pairs aligned along a first axis;
- a first memory cell connected to said first bitline pair and a second memory cell connected to said second bitline pair;
- a first match line and a first word line aligned along a second axis, said first match line and said first word line connecting said first and said second memory cells defining a first row in a first column;
- a second row defined above said first row, said second row comprising a third memory cell and a fourth memory cell, said third and for memory cells connecting said first and second bitline pairs and a second word line and a second match line;
- said first bitline pair comprising a twisted structure between said first row and said second row;
- said second bitline pair comprising a second twisted structure between said first row and said second row;
- said first memory cell having a first orientation and said second memory cell having a second orientation, wherein said second orientation is a mirror image of said first orientation;
- said third memory cell having a third orientation, said third orientation being rotated 180 degrees with respect to said first orientation; and
- said fourth memory cell having a fourth orientation, said fourth orientation being rotated 180 degrees with respect to said second orientation.

4. A semiconductor memory device according to claim 3, wherein said memory device is a Content Addressable Memory (CAM).

5. A semiconductor memory device according to claim 3, wherein said memory cells are based on Static Random Access Memory cells.

6. A semiconductor memory device according to claim 3, further comprising a first ternary cell, said first ternary cell comprising said first and said second memory cells.

7. A semiconductor memory device according to claim 3, further comprising a second ternary cell, said second ternary cell comprising said third and said fourth memory cells.

8. A method for making a twisting structure in a content addressable memory (CAM), comprising:
- (a) forming substantially parallel first and second bitline traces in a first conductive layer over a substrate, said first and second bitline traces each having a region of discontinuity, said regions being staggered along the length of said traces and separating each said bitlines into first and second segments;
- (b) forming in a second conductive layer a first connection between the first segment of said first bitline trace and the second segment of said second bitline trace; and
- (c) forming in said second conductive layer a second connection between the first segment of said second bitline trace and the second segment of said first bitline trace such that said first and second connections are of substantially the same length.

9. A method as defined in claim 8, including a via coupling said connections to said segments.

10. A twisting structure in a content addressable memory (CAM), comprising a substantially parallel first and second bitline traces formed in a first conductive layer over a substrate, said first and second bitline traces each having a region of discontinuity, said regions being staggered along the length of said traces and separating each said bitlines into first and second segments; a second conductive layer having a first connection formed between the first segment of said first bitline trace and the second segment of said second bitline trace and in said second conductive layer a second connection is formed between the first segment of said second bitline trace and the second segment of said first bitline trace, such that said first and second connections are of substantially the same length.

11. A content addressable memory comprising:
- (a) an array of ternary static random access memory cells;
- (b) a plurality of pairs of bitlines and at least one of said bitline including a twisted structure comprising:
  - i. a substantially parallel first and second bitline traces formed in a first conductive layer over a substrate, said first and second bitline traces each having a region of discontinuity, said regions being staggered along the length of said traces and separating each said bitlines into first and second segments;
  - ii. a second conductive layer having a first connection formed between the first segment of said first bitline trace and the second segment of said second bitline trace; and
  - iii. in said second conductive layer a second connection is formed between the first segment of said second bitline trace and the second segment of said first bitline trace, such that said first and second connections are of substantially the same length.

12. A CAM as defined in claim 11, said ternary cells comprised of a pair of ternary half cells, each ternary cell being formed in said substrate with its respective said ternary half cells oriented in a mirror imaged relationship, and the ternary cells in adjacent rows being oriented in a mirror imaged relationship.

* * * * *